United States Patent
McAnelly et al.

(10) Patent No.: US 10,132,875 B1
(45) Date of Patent: Nov. 20, 2018

(54) DEVICE AND METHOD FOR OPEN PHASE DETECTION

(71) Applicants: Michael L. McAnelly, Baton Rouge, LA (US); Jeremy S. Davey, Denham Springs, LA (US); Randall P. Robert, Denham Springs, LA (US); Donald J. Norris, Prairieville, LA (US); Robert P. Bayly, Baton Rouge, LA (US)

(72) Inventors: Michael L. McAnelly, Baton Rouge, LA (US); Jeremy S. Davey, Denham Springs, LA (US); Randall P. Robert, Denham Springs, LA (US); Donald J. Norris, Prairieville, LA (US); Robert P. Bayly, Baton Rouge, LA (US)

(73) Assignee: Power Control Systems, Inc., Baton Rouge, LA (US)

( * ) Notice: Subject to any disclaimer, the term of this patent is extended or adjusted under 35 U.S.C. 154(b) by 1046 days.

(21) Appl. No.: 14/262,267

(22) Filed: Apr. 25, 2014

Related U.S. Application Data

(60) Provisional application No. 61/839,501, filed on Jun. 26, 2013, provisional application No. 61/815,873, filed on Apr. 25, 2013.

(51) Int. Cl.
*H02H 3/12* (2006.01)
*G01R 31/40* (2014.01)
(Continued)

(52) U.S. Cl.
CPC .......... *G01R 31/40* (2013.01); *H02H 1/0007* (2013.01); *H02H 9/001* (2013.01)

(58) Field of Classification Search
CPC .......... H02H 3/08; H02H 1/007; H02H 9/001; G01R 31/40
See application file for complete search history.

(56) References Cited

U.S. PATENT DOCUMENTS

| | | | | |
|---|---|---|---|---|
| 3,202,875 A | * | 8/1965 | Bateman | H02H 3/422 361/44 |
| 3,694,713 A | * | 9/1972 | Duren | B06B 1/0253 318/116 |

(Continued)

FOREIGN PATENT DOCUMENTS

GB      2126753     *   9/1982 ............. G05B 11/14

*Primary Examiner* — Zeev V Kitov
(74) *Attorney, Agent, or Firm* — Jessica C. Engler; Russel O. Primeaux; Kean Miller LLP

(57) ABSTRACT

A high accuracy open phase detection system for power transformers that uses a combination of logic controllers and current transformers to recognize an open phase condition experienced by the power transformers under no load, light load, and full load conditions. A current to voltage and current to current transformer on each phase are employed to detect the excitation current and load current conditions. During an open phase condition, a microprocessor detecting device, connected to the current to voltage and current to current transformers, monitors the appropriate power system quantities to determine the existence of one or more open phase(s) with or without a ground or an open phase with line charging capacitance. Through the microprocessor monitor, the microprocessor detecting device can alert operators to the loss of phase or abnormal conditions in the power source. The data used by the microprocessors can be used to calculate the magnitude and phase angle of the current in the power source and detect abnormal system conditions. This invention also employs a unique circuitry configuration to reduce the effects of ambient noise on the open phase detection system.

11 Claims, 3 Drawing Sheets

(51) Int. Cl.
*H02H 9/00* (2006.01)
*H02H 1/00* (2006.01)

(56) References Cited

U.S. PATENT DOCUMENTS

| | | | | |
|---|---|---|---|---|
| 4,363,066 A | * | 12/1982 | Bishop | H02H 3/343 |
| | | | | 361/85 |
| 4,466,071 A | * | 8/1984 | Russell, Jr. | H02H 1/0015 |
| | | | | 324/520 |
| 4,719,559 A | * | 1/1988 | Sokal | H02M 7/53803 |
| | | | | 363/132 |
| 6,002,260 A | * | 12/1999 | Lau | G01R 15/142 |
| | | | | 324/509 |
| 9,413,156 B2 | * | 8/2016 | O'Brien | H02H 3/02 |
| 2005/0286184 A1 | * | 12/2005 | Campolo | H02H 1/0015 |
| | | | | 361/42 |
| 2007/0064365 A1 | * | 3/2007 | Buxton | H02H 7/222 |
| | | | | 361/93.1 |

\* cited by examiner

DEVICE AND METHOD FOR OPEN PHASE DETECTION

This application claims the benefit of U.S. Provisional Patent Application No. 61/839,501 filed on Jun. 26, 2013 and U.S. Provisional Patent Application No. 61/815,873 filed on Apr. 25, 2013. The disclosures of the referenced applications are hereby incorporated herein in their entirety by reference.

The present invention relates to the field of detecting the various open phase and/or faulted conditions of a power source to ensure the integrity of offsite, backup power sources for nuclear power plants.

Since the implementation of nuclear power facilities, there has been a strong concern regarding the potential hazard of release of radioactive materials from facilities generating electricity with nuclear power. Nuclear power safety depends on intelligent planning, proper design of backup systems, high-quality components, and a well-developed culture of safety in operations. The backup systems in nuclear power plants are generally composed of offsite transformers and onsite emergency generators, and these systems can be used to power the emergency operations of a nuclear power plant when the onsite power source is shut down, known as "Reactor SCRAM." United States nuclear power plants are designed to cope with Reactor SCRAM by having multiple backup power sources at the ready. The Nuclear Regulatory Commission requires United States nuclear power plants to demonstrate they can handle such situations in order to meet NRC licensing requirements and legally remain in operation.

The offsite power systems are typically referred to as Reserve Station Service power transformers, Startup/Standby transformers, or Start-Up power transformers. When there is a loss of onsite power or an abnormal condition at the facility, the power source of the critical safety systems is automatically transferred to the offsite Reserve Station Service power transformers (hereinafter the "RSS transformers"). If there is a loss of power from the RSS transformer, emergency backup diesel generators begin operating to provide electrical power to the plant safety systems.

Given the critical task that the back-up and emergency power sources serve, there has been increased concern regarding their reliability. Open phase conditions in the back-up power systems have presented a particularly troublesome problem, as the open phase condition in the system has historically been difficult to detect with existing technology.

The challenge that comes with detecting and remedying open phase conditions of the backup power source is the difficulty of measuring the low-level transformer excitation currents. The power transformers used for Reserve Station Service duty in power plants are typically unloaded when the plant is in normal operation and draw only excitation current. These transformers are fed from the high voltage power grid and are small in capacity when compared to the available capacity of the high voltage power grid. Transformer excitation current is typically less than 0.1% of the power transformer's full load capacity. It is very difficult to measure quantities of this value for power transformers connected to high voltage systems because accurate direct measurement is a near impossible task. Modern, state-of-the-art sensing devices used in relay systems fed from the typical bushing current transformers are not capable of recognizing the wide variations in conditions, for example, the range of 0.08 amps to 22,000 amps. Measurements have to be performed using current transformers to isolate the measuring devices from the dangerous, high voltage circuits which operate as high as 500,000 volts. These measuring devices are typically low voltage and low power consuming devices that operate in the range of several volts. The measuring devices require connection to the current transformers to monitor quantities of the high voltage system. However, those measuring devices' accuracy often suffer due to ambient noise that is present in the high voltage system. Prior to the disclosed method and device, there were no methods for detecting open phase conditions on energized, unloaded or lightly loaded transformers.

SUMMARY OF THE INVENTION

The present invention addresses all of the problems of prior technologies. This invention utilizes a unique arrangement of logic controllers and current sensors that are able to recognize the open-phase condition. High impedance voltage measuring devices are used to measure lower level currents, which is necessary for the measurement of power transformer excitation current.

The device and method is comprised of current sensors which are connected to the power source for detection of open phase and abnormal conditions. Each current sensor is comprised of one current to voltage transformer (hereinafter "CV transformer") and one current to current transformer (hereinafter "CT transformer"). The CV transformer is used for monitoring the power source during unloaded and energized conditions. The CT transformer is used for monitoring the power source during loaded conditions. The current sensors are placed on each phase of the high side winding of the power source that is being monitored for open phase or abnormal conditions. Each CV transformer has its full secondary winding leads connected to the high impedance voltage measuring device during energized power transformer no load conditions. The invention utilizes high impedance devices for measuring the voltage on the secondary windings of the CV transformers. This data is used to determine, for the power source, the power transformer excitation current, loss of transformer excitation current, phase angle of the power transformer excitation current, and abnormal system conditions. Abnormal system conditions include: loss of a single phase, loss of multiple phases, loss of phase with a short-circuit connected to the power transformer line, open phase with line charging capacitance, open jumper inside of the power transformer, open tap-changer connection in the power transformer, open switch contact, open breaker contact, and other similar conditions with the power source.

The open phase detection system is further comprised of a novel arrangement of microprocessor based components with specially designed sensors and associated circuitry. The system also includes power sensing devices that can measure the wide range of power system quantities. The sensors are specially designed to have the ability to measure and operate at all levels, including low level excitation current, lightly loaded conditions, full load current, and current under various faulted conditions. The microprocessors are programmed with an algorithm that smoothes the measured current and compares the measured current to normal operation quantities to determine the existence of abnormal conditions. The sensors also have the ability to withstand the high levels of fault current and are configured to provide maximum noise immunity. The secondary winding of the sensors are connected in a balanced circuit configuration, with a grounded center tap, and use shielded cable to minimize ambient noise from common-mode coupling.

The system is capable of communication through the microprocessors in order to convey information about the power system and the open phase detection system to the control room. The system uses communication media to the control room for annunciation purposes. The system is also equipped with data logging for tracking operating quantities for comparison with power system disturbances for evaluation of correct operation. This also includes time-synchronization with a self-contained satellite clock. The system will be capable of tripping source circuit-breakers when tripping is required. The system also has appropriate test switches and disconnect switches to provide the ability to test and isolate in a safe, reliable manner.

The system incorporates special noise immunity features to facilitate consistent, correct operation in the noisy, high-voltage substation environment. A benefit of the open phase detection system is that it achieves correct detection of open phase conditions on power transformers drawing only excitation current. This feature is unique because it performs this function in an environment where ambient noise in the power system is very high in relation to the very small excitation current of a transformer.

In the event of an open phase condition, these components work together to alert the operators of the open phase condition. The current sensors transmit the magnitude and phase angle of each phase to the microprocessors. The microprocessors will evaluate the current magnitude and phase angle to determine whether an open phase or other abnormal conditions exists on the power system. If such a condition exists, the microprocessor communication system will then alert the system operators to the open phase or abnormal condition.

This invention also utilizes additional windings that are molded into the CV transformers and CT transformers in order to provide users the ability to use precise primary injection testing in order to test the entire open phase detection system.

DETAILED DESCRIPTION OF THE INVENTION

Figure 1:
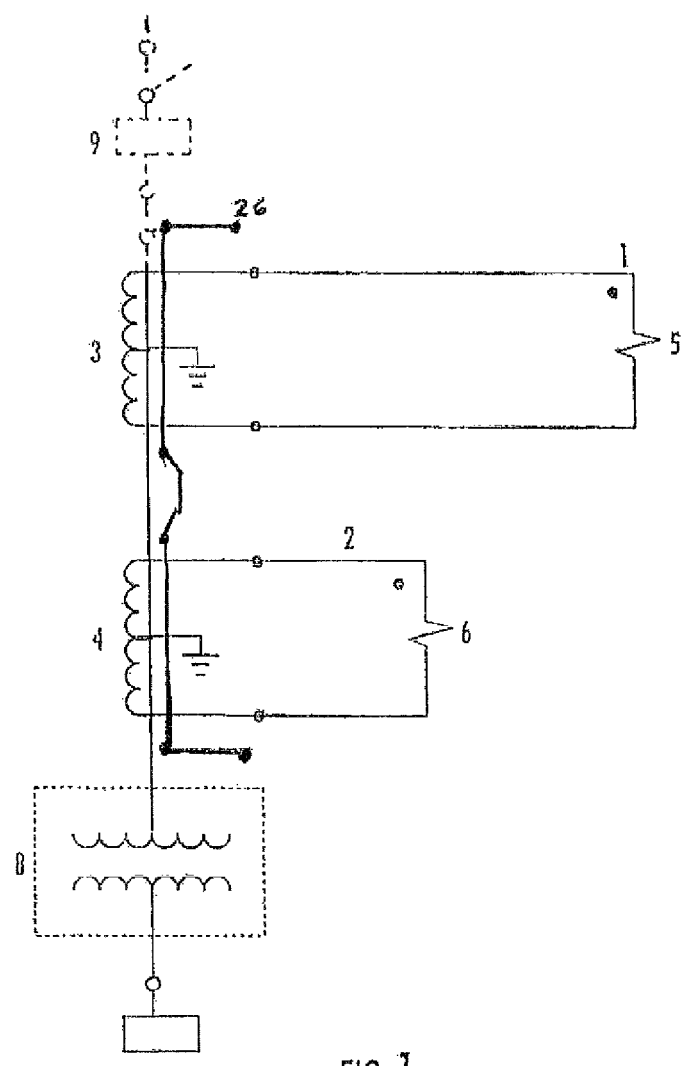
FIG. 1 is a single-line diagram of the circuit configuration of the open phase detection system.

The method and apparatus disclosed herein is an open phase detection system that detects open phase conditions on unloaded and loaded auxiliary power systems and offsite power sources. For the preferred embodiment, the offsite power sources are the RSS transformers and the associated power supply system. Additionally, this system detects open phase with faulted conditions on the transformer side of the open phase. The system is capable of monitoring, alarming, and tripping as required for specific plant application.

The system utilizes current sensors, which consists of two instrument transformers. These instrument transformers are window type transformers that are completely electrically isolated from the power conductors. This type of instrument transformer is magnetically coupled and not physically connected to the power system conductors such that the instrument transformer does not introduce an additional point of failure to the offsite power source. The first is a high ratio, high burden capacity CV transformer that is used for the measurement of the excitation current of each phase of the RSS transformer. The second is a low ratio, low burden capacity CT transformer that is used to measure the detection of open phase conditions when the RSS transformer is loaded. These CV and CT transformers are placed in the most convenient location for measuring the current in each phase of the high side winding of the RSS transformer. These CV and CT transformers may be contained in a single structure or separate structures as necessary for the application. Space limitations and obstructions will dictate the structure configuration and physical dimensions.

The CV transformer on each phase is used to monitor the offsite power source in the energized, unloaded mode, and each phase shall have the secondary winding leads connected to the measuring device. The CV transformer secondary winding will be a high ratio winding specifically designed for monitoring the RSS transformer excitation current. The secondary winding of this CV transformer is center tapped and connected to ground to provide connection in a balanced configuration and to provide common-mode noise rejection. The CT transformer is a multi-ratio transformer with the appropriate ratios and taps to closely match the RSS transformer at full-load current and to accomplish measurement without saturation or overload. In order to properly measure both the excitation current and the full-load current, the CV and CT transformers are connected around the primary conductors between the offsite power source breaker and the Wye-point of the RSS transformer. The devices can be mounted around the base of the transformer high voltage bushings of the high side winding or around the base of each phase of the high side neutral bushings if available. For a Delta connected high side winding, the CV and CT transformers are mounted on each phase between the source breaker and on or around the high side bushing. The primary winding of the CV and CT transformers is the high voltage conductor of the power system. In some applications, an additional CT transformer will be required on the RSS transformer between the Wye point and the system ground for measurement of power transformer neutral current. This device is necessary to protect the transformer in the event of an open and grounded condition. For transformers with a Delta high side connection, this additional CT transformer would not be applicable.

Ambient noise in power systems is extremely high; therefore, the sensors and microprocessor are specially designed and configured to mitigate the effects of noise in the system so that the small excitation current can be detected. By center-tapping the CV transformers, a balanced configuration is achieved which helps improve signal to noise ratio. Twisted, shielded pairs of wire also can be used to provide further improvement of the signal to noise ratio in the substation. Lead lengths from the CV and CT transformers to microprocessor location are preferably limited to 100 feet to limit the effects of noise in a high voltage environment.

The RSS transformer makes use of CV and CT transformers on each phase. Each CV transformer is used as the excitation current sensor and each CT transformer is used as the load current sensor. The excitation and load sensors are specially designed electromagnetic sensors. The sensors can be concentric and are sized for the appropriate application based upon the capacities of the offsite power source presently on the system. The sensors are also designed to meet the dimensional requirements for installation on the RSS transformer. The components inside of the excitation and load sensors consist of a laminated, magnetic core material and secondary windings typically made of copper. The core material and windings can vary to match the excitation current, load currents, and physical dimensions. The sensor material will commonly be comprised of copper and iron; however, based upon the size, voltage, and features of the transformer and additional conditions of the application, other materials may be used. The sensors themselves will typically use a combination of materials, such as the suggested copper and iron, and the ratio between the two materials is optimized based upon the size, voltage, and other conditions of the application.

In order to construct the proper windings for the excitation sensor and the load sensor, one skilled in the art would first determine the excitation current and load current, plus the operating range of those currents, as set by the rating of the transformer. Generally, this information can be obtained through a transformer test report. A person skilled in the art would, based upon the current information contained in the test report, be able to construct the proper winding ratio needed for this application.

If desired, the excitation sensor and the load sensor can be placed on the bushings of the RSS transformer, so as to not encroach on the existing system.

As seen in FIG. 1, the system is comprised of the excitation monitoring sub-system 1 and the load monitoring sub-system 2. The device is magnetically coupled between the offsite power source breaker 9 and the Wye-point of the offsite power source 8. For the explained example embodiment, the offsite power source 8 is an RSS transformer. In the excitation monitoring sub-system 1, the excitation monitoring CV transformer 3 is connected in parallel with the microprocessor voltage measuring device 5. In the load monitoring sub-system 2, the load monitoring CT transformer 4 is connected in series with the microprocessor current measuring device 6. The microprocessor components include a hardware platform with analog input circuitry for measurements, coded algorithms for decision making, and inputs and outputs for monitoring, tripping, and alarming.

Within the coded algorithm, the abnormal conditions are identified, and the logical evaluations are made to alarm or trip as required. Among others, these abnormal conditions could be an open phase conductor to the RSS transformer or an open phase condition within the RSS transformer itself. The microprocessor devices are capable of detecting from current magnitudes and phase angles the existence of open or open with grounded conditions on the high side supply to the RSS transformer and, if required, provide coordinated tripping with other optional system protective devices. The microprocessors of the system use a specialized algorithm to detect an open phase or abnormal condition on the RSS transformer. In the system, the load monitoring CT transformer 6 detects the analog values of the magnitude and phase angle of the load currents for each phase of the RSS transformer. The magnitude and phase angle of each phase current and the zero sequence current is measured. For each current measurement, the microprocessor relay/device performs an analog to digital conversion for the signals.

Once the conversion is performed, the microprocessor algorithm calibrates the current data using a smoothing function. Smoothing functions are often used in statistics and image processing to capture important patterns in data, while leaving out noise or other fine-scale structures and rapid phenomena. In the smoothing function, the original points are reduced to prevent rapid, high-frequency step changes from resulting in false output operations. The smoothing function utilized in this application adds a small portion of the actual measured current to the historical, existing current once every processing interval. In the preferred embodiment, 0.1% of the actual measured current is added to 99.9% of the historical, existing current quantity to derive a new historical current value. This ensures that, should the measured current quantity change quickly, the historical current value actually evaluated for abnormal conditions changes more slowly. Time delays can also be applied at various points in the algorithm to make it less susceptible to false output operations.

The smoothing function provides calibrated quantities for the magnitudes and phase angles for each phase current. The calibrated values for each phase current are passed through separate comparator gates in the algorithm. An open phase condition is declared when historical current magnitude is below a certain percentage of the nominal magnitude of a normal, no load excitation condition and at least one of the other phases has a current magnitude above a certain percentage of the nominal magnitude of a normal, no load excitation current condition. In the preferred embodiment, these percentages would be below 20% and above 70% of the nominal no load excitation magnitude of a current condition, respectively. If an open phase condition is detected, a logical 1 will be generated by the comparator gate and if the logical 1 exceeds a certain time delay, the algorithm will close the output contact, indicating an open phase condition.

The algorithm will perform a second analysis to detect an open phase condition when the open conductor is also grounded. The zero sequence phase quantity (magnitude and phase angle) measured is divided by the positive sequence quantity. If the dividend produced exceeds a certain value, then an open phase with a grounded condition is declared. The specific minimum dividend value to assert an alarm is based upon the particular power transformer and can be easily generated by one skilled in the art.

The section of the algorithm in the microprocessors described above performs its function in the no load excitation mode. However, if the value of the current exceeds a certain amount, the algorithm switches off the excitation mode and the current level will be high enough to be detectable by the load mode section of the algorithm. In the preferred embodiment, that certain amount is three times the no load excitation current value. In the load mode, the zero sequence phase quantity (magnitude and phase angle) measured is divided by the positive sequence quantity. If the dividend produced exceeds a certain value, then an open phase condition is declared by the algorithm. This state mirrors the excitation mode method; so, under the load mode state, the comparator gates will raise a logical 1 if the ratio of zero sequence to positive sequence current is above a certain level.

The microprocessor monitors are equipped with communications processors for trending data and for sequential event recording. An integrated GPS clock is also used to provide synchronized measurements of event data recorded in the microprocessor so that it may be compared to other recording data on the transmission system.

Figure 3:
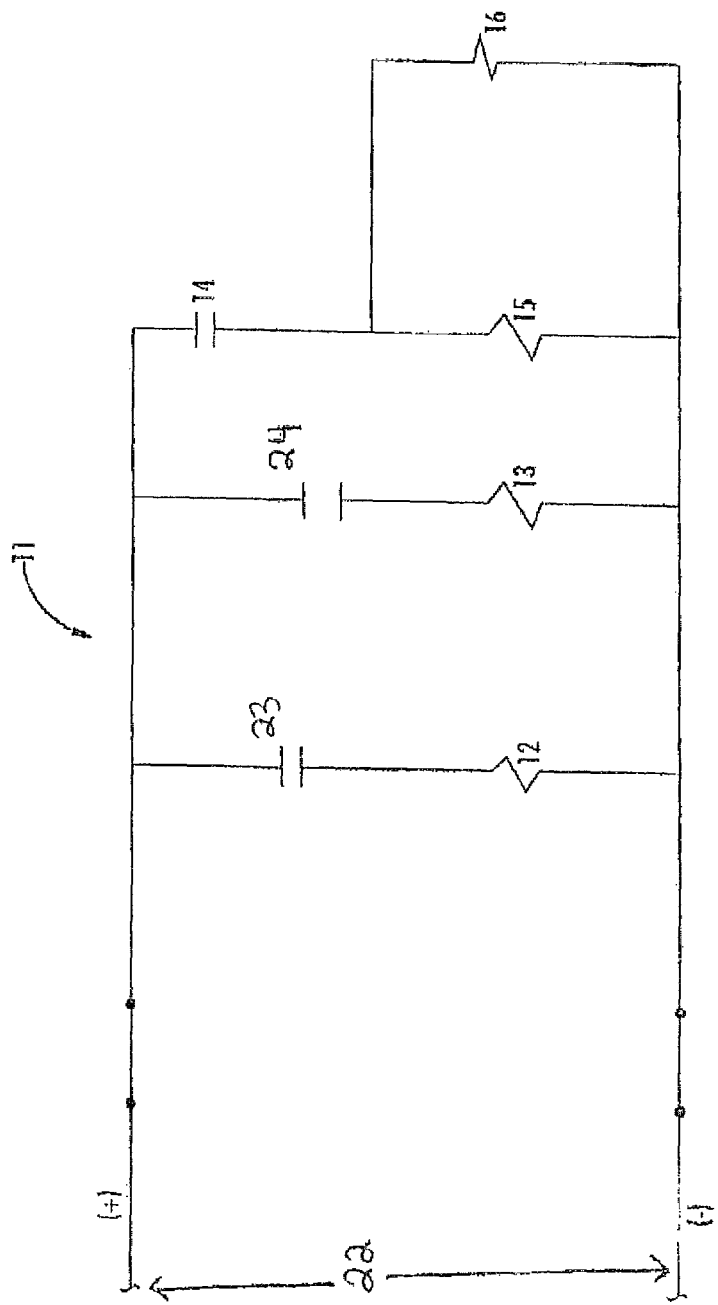
FIG. 3 is a single-line drawing of the DC control circuit that is connected to the microprocessor volt measuring device of the excitation circuit in the open phase detection system.

The microprocessor output is connected to an alarm circuit that is used to alert the operators of an open phase condition. The alarm circuit 11 is depicted in FIG. 3. Control power 22 is preferably supplied to the microprocessors and control relays from a secure power source located in the power plant such as, for example, a DC powered battery. In the alarm circuit 11, the microprocessor output 23 is connected in series to a relay 12 to short circuit the excitation monitoring instrument transformer 3. The microprocessor has multiple outputs 24 and 14 that are used for tripping purposes, power plant control room annunciation purposes, and local annunciation at the relay cabinet. When the microprocessor detects an open phase or abnormal condition on the power source, the microprocessor will send the signal for output 14 to close. This will operate the local annunciator 15 and control room annunciator 16. The control room annunciator 16 and the local annunciator 15 provide indication of the various open phase conditions.

During an open phase condition, the excitation monitoring sub-system 1 through the microprocessor voltage monitoring device 5 makes decisions based on the microprocessor algorithm to alarm or trip for the various open phase conditions in the excitation mode. The microprocessor current measuring device 6 monitors the conditions of the phases and performs calculations to determine the magnitude and phase angle of the abnormal conditions by the algorithm. Once it has made the determination that a phase is open, the microprocessor system will alert the operators via annunciation panels 15 and 16 that a phase is open. Based upon the signals and readings provided by the open phase detection system, plant operations personnel can take appropriate mitigating action. In some cases, automatic tripping of the power source may be required depending on the configuration of the individual plant application.

Figure 2:
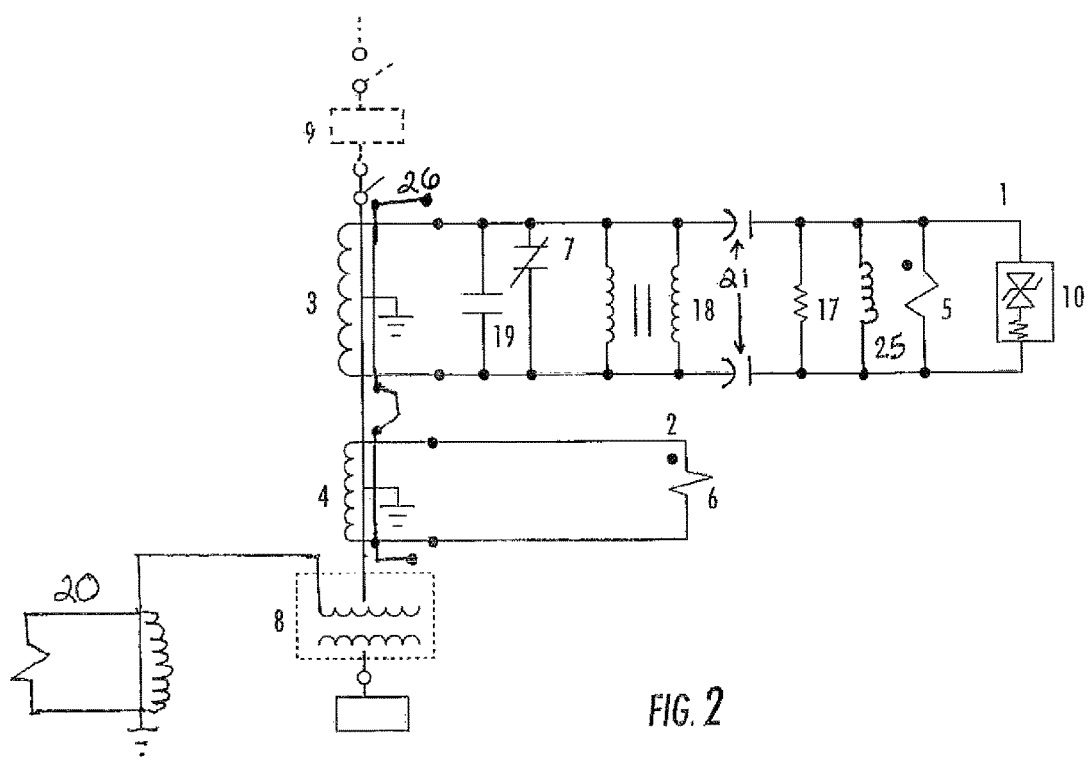
FIG. 2 is a single-line drawing of the circuit configuration of the open phase detection system with additional components connected, demonstrating additional embodiments.

In FIG. 2, additional optional components are connected to protect the open phase detection system. Depending on the needs of the open phase detection system, surge protection can be used to protect equipment and personnel from the high transient conditions that could be introduced from the high voltage power system and its reactive components. In one embodiment, a surge protection device 10 is connected in parallel to the microprocessor voltage measuring device 5.

For an RSS transformer that is connected in a Wye configuration on the high side of the transformer, an additional, zero sequence instrument transformer will be required. This zero sequence instrument transformer 20 is a CT transformer and is connected to the offsite power source 8 between the offsite power source's Wye point and the system ground. This zero sequence instrument transformer 20 is used to measure any transformer neutral current. This device is necessary to protect the RSS transformer in the event of an open and grounded condition. For transformers with a Delta high side connection, the zero sequence instrument transformer 20 would not be applicable nor necessary.

If zero sequence instrument transformer 20 has been included, the comparator gates in the algorithm will also test for abnormal conditions measured by the zero sequence instrument transformer 20. The microprocessor algorithm will detect a zero sequence fault scenario when there is an open phase condition or ground fault detected with the zero sequence instrument transformer. In this case, the algorithm would be analyzing the magnitude of the current from the zero sequence instrument transformer. The comparator gate will raise a logical 1, or output alarm condition, if the value of the output to the microprocessor exceeds a preset value, indicating a phase-to-ground fault or an open phase condition on the electrical source. The preset maximum value is based upon the particular transformer and can be easily generated by one skilled in the art.

In some applications, the current levels during load conditions could damage the excitation monitoring sub-system components. Therefore, some applications may require a switching device, such as an auxiliary relay actuated by the load current measuring sub-system, to short-circuit the excitation current monitoring instrument transformer to allow continuous operation when the RSS transformer current level is above the no load excitation level. This will depend on the particular design characteristics of the CV transformer and its self-limiting capabilities. In the preferred embodiment, the CV transformer will be designed with surge and overvoltage protection to allow continuous operation under load current conditions. As seen in FIG. 2, the short-circuiting relay 19, would be connected in parallel with the microprocessor volt measuring device 5 and the excitation sensor 3. The short-circuiting relay is powered by the control power circuit 11. During an open phase condition where shorting relay 19 has been included, once the current levels are above minimum load levels, the short circuiting relay will short circuit the excitation monitoring sub-system, protecting the circuit and equipment.

In some applications, additional load impedance may be implemented to optimally match the output impedance of the excitation sensor to the input impedance of the microprocessor based measuring equipment. In one embodiment, a load resistor 17 can be connected in parallel, as seen in FIG. 2, to perform this function.

In another embodiment, additional components can be used to enable a more accurate metering capability. In FIG. 2, an auxiliary transformer 18 has been connected in parallel to step up the voltage to enable more accurate metering capabilities.

In applications where over voltage of the excitation CV transformer could occur, a saturable reactor could also be connected in parallel with the excitation CV transformer in order to limit voltage and prevent saturation of the CV transformer core. In FIG. 2, a saturable reactor 25 has been connected in parallel for this application. The voltage of the excitation CV transformer is limited by the said saturable reactor to protect equipment and personnel.

Some applications may require a method for short circuiting the excitation monitoring instrument transformer upon loss of control power. The loss of control power protective device 7 can be seen in FIG. 2. An example of a loss of control power protective device is an auxiliary relay.

In some cases, the output voltage of the excitation sensor may not be high enough to provide reliable excitation monitoring. Series-compensating capacitors can be added in series between the output of the step up transformer and the voltage monitoring element of the microprocessor to offset system reactance and increase microprocessor voltage input. In FIG. 2, series-compensating capacitors 21 have been added for this application.

For all of the additional components added in FIG. 2, those components can be duplicated to ensure system protection, safety, and reliability.

To ensure the operability of the system, a means for applying a test current to the primary winding of the CV and CT transformers is necessary to allow personnel to perform testing without having to access the dangerous, high voltage conductor passing through the CV and CT transformer primary windows. This is accomplished by adding a test winding 26 passing through the CV and CT transformer windows. Test winding 26 is then wired to the microprocessor relay location. This test winding 26 will allow for connection of the relay as well as the CV and CT transformer primary windings to a commercial testing device without leaving the immediate proximity of the microprocessor relay.

The test winding is manufactured within the molding of the CV and CT transformers and brought out to the CV and CT transformer junction box where it is then wired to connect within the relay cabinet of the open phase detection system. This test winding will be polarity marked in the same manner as the primary and secondary winding of the CV and CT transformers. This will allow complete testing of the open phase detection system by primary injection. Test systems like state simulators, used for testing protective relays, can be used to test the entire open phase detection system and the CV and CT transformers. Precise primary injection testing can thus be performed.

We claim:

1. A device for detecting open phase conditions of a power system transformer, comprising:
   a. an excitation monitoring sub-system for detecting an open phase when said power system transformer is unloaded or partially loaded, with a current at an amount of at least one-tenth percent of the power system transformer's load, said excitation monitoring sub-system comprising:
      i. an excitation monitoring current to voltage transformer; and
      ii. a microprocessor voltage measuring device;
   b. a load monitoring sub-system for detecting an open phase when said power system transformer is loaded, with currents as high as fault current in the 10,000 A range, said load monitoring sub-system comprising:
      i. a load monitoring current to current transformer on each phase; and
      ii. a microprocessor current measuring device; and
   wherein said excitation monitoring current to voltage transformer and said load monitoring current to current transformer are magnetically coupled for direct measurement of the power system transformer's primary currents.

2. The device of claim 1, wherein said power source includes a grounded neutral, and said open phase detection device further comprises an additional current to current transformer for monitoring the grounded neutral.

3. The device of claim 1, wherein said excitation monitoring sub-system further comprises an auxiliary transformer.

4. The device of claim 1, wherein said excitation monitoring sub-system further comprises a shorting relay to short the excitation monitoring sub-system when the current levels are above minimum load levels.

5. The device of claim 1, wherein said excitation monitoring sub-system further comprises a non-electronic surge protector.

6. The device of claim 1, wherein said excitation monitoring sub-system further comprises an overvoltage protection device.

7. The device of claim 1, wherein said excitation monitoring sub-system further comprises an annunciator panel electrically connected to the microprocessor voltage measuring device, wherein said annunciator panel will display local information power system conditions and the microprocessor voltage measuring device's and microprocessor current measuring device's respective components' health.

8. The device of claim 1, wherein said microprocessor voltage measuring device is capable of detecting the conditions of the power source and magnitude, phase angle, sequence components, harmonic content, and waveform quality of the power source current.

9. The device of claim 1, wherein the excitation monitoring current to voltage transformer and load monitoring current to current transformer are each individually center-tapped to ground in a balanced configuration to provide common-mode noise rejection.

10. The device of claim 1, wherein said excitation monitoring sub-system further comprises series-compensating capacitors connected between the excitation monitoring current to voltage transformer and the microprocessor voltage measuring device to offset system reactance and effectively increase the excitation monitoring current to voltage transformer output.

11. The device of claim 1, wherein
   a. said device further comprises an additional current to current transformer for monitoring the grounded current when said power source includes a grounded neutral;
   b. wherein the excitation monitoring sub-system further comprises:
      i. an auxiliary transformer;
      ii. a shorting relay for shorting the excitation monitoring sub-system when current levels are above minimum load levels;
      iii. a surge protector;
      iv. an over-voltage protection device;
      v. an annunciator panel electrically connected to the microprocessor voltage measuring device, wherein said annunciator panel will display local information about the power system conditions; and
      vi. series-compensating capacitors connected between the excitation monitoring current to voltage transformer and the microprocessor voltage measuring device;
   c. wherein the microprocessor voltage measuring device is capable of detecting the conditions of the power source and the magnitude and phase angle of the current of the power source; and
   d. wherein each current to voltage transformer is individually center-tapped to ground in a balanced configuration to provide common-mode noise rejection.

\* \* \* \* \*